(12) United States Patent
Wang et al.

(10) Patent No.: US 11,495,775 B2
(45) Date of Patent: Nov. 8, 2022

(54) LIGHT-EMITTING DEVICE INCLUDING ENCAPSULATION LAYERS HAVING DIFFERENT REFRACTIVE INDEXES, METHOD OF MANUFACTURING THE SAME AND ELECTRONIC APPARATUS

(71) Applicant: BOE TECHNOLOGY GROUP CO., LTD., Beijing (CN)

(72) Inventors: Qing Wang, Beijing (CN); Kuanta Huang, Beijing (CN); Xiaochuan Chen, Beijing (CN); Yongfa Dong, Beijing (CN); Xiong Yuan, Beijing (CN); Dongsheng Li, Beijing (CN); Hui Tong, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 115 days.

(21) Appl. No.: 16/959,400

(22) PCT Filed: Aug. 27, 2019

(86) PCT No.: PCT/CN2019/102878
§ 371 (c)(1),
(2) Date: Jun. 30, 2020

(87) PCT Pub. No.: WO2021/035543
PCT Pub. Date: Mar. 4, 2021

(65) Prior Publication Data
US 2021/0408482 A1  Dec. 30, 2021

(51) Int. Cl.
*H01L 51/10*  (2006.01)
*H01L 51/52*  (2006.01)
(Continued)

(52) U.S. Cl.
CPC ........ *H01L 51/5256* (2013.01); *H01L 27/322* (2013.01); *H01L 27/3211* (2013.01);
(Continued)

(58) Field of Classification Search
CPC .............. H01L 51/107; H01L 51/448; H01L 51/5237; H01L 51/524; H01L 51/5253; H01L 51/5256; H01L 51/56
(Continued)

(56) References Cited

U.S. PATENT DOCUMENTS 9,985,241 B2 * 5/2018 Koshihara ........... H01L 51/5253
10,553,827 B2  2/2020 Jang et al.
(Continued)

FOREIGN PATENT DOCUMENTS

CN  102244202 A  11/2011
CN  106684256 A  5/2017
(Continued)

OTHER PUBLICATIONS

The First Chinese Office Action dated Sep. 9, 2021; Appln. No. 201980001513.5.
Partial Supplementary European Search Report: dated Aug. 2, 2022; Appln. No. 19933215.6.

*Primary Examiner* — Hoai V Pham

(57) ABSTRACT

A light-emitting device, a method of manufacturing the same and an electronic apparatus. The light-emitting device includes a silicon-based base substrate; at least one organic light-emitting diode device at the silicon-based base substrate; a first encapsulation layer, at a side of the at least one organic light-emitting diode device away from the silicon-based base substrate and including one or more sublayers; a color filter layer, at a side of the first encapsulation layer away from the at least one organic light-emitting diode device; and a second encapsulation layer, at a side of the color filter layer away from the first encapsulation layer and
(Continued)

including one or more sublayers. A refractive index of at least one sublayer in the first encapsulation layer is greater than a refractive index of at least one sublayer in the second encapsulation layer.

19 Claims, 5 Drawing Sheets

(51) Int. Cl.
  *H01L 27/32* (2006.01)
  *H01L 51/00* (2006.01)
  *H01L 51/56* (2006.01)

(52) U.S. Cl.
  CPC ...... *H01L 51/0096* (2013.01); *H01L 51/5275* (2013.01); *H01L 51/56* (2013.01); *H01L 2251/558* (2013.01)

(58) Field of Classification Search
  USPC .......................................................... 257/40
  See application file for complete search history.

(56) References Cited

U.S. PATENT DOCUMENTS

| | | |
|---|---|---|
| 2009/0195152 A1 | 8/2009 | Sawano |
| 2018/0026087 A1 | 1/2018 | Lee et al. |
| 2018/0277609 A1 | 9/2018 | Fukiwara et al. |

FOREIGN PATENT DOCUMENTS

| | | |
|---|---|---|
| CN | 108039421 A | 5/2018 |
| CN | 109103219 A | 12/2018 |
| CN | 110034164 A | 7/2019 |

\* cited by examiner

LIGHT-EMITTING DEVICE INCLUDING ENCAPSULATION LAYERS HAVING DIFFERENT REFRACTIVE INDEXES, METHOD OF MANUFACTURING THE SAME AND ELECTRONIC APPARATUS

TECHNICAL FIELD

Embodiments of the present disclosure relate to a light-emitting device, a method of manufacturing the same and an electronic apparatus.

BACKGROUND

With the characteristics of a full solid state, active light emission, high luminance, a high contrast, ultra-thinness, ultra-lightness, low power consumption, no viewing-angle limitation, a wide working temperature range, or the like, an OLED (Organic Light Emitting Diode) is the third-generation display technology following a CRT (Cathode Ray Tube) display and an LCD (Liquid Crystal display).

SUMMARY

At least one embodiment of the present disclosure provides a light-emitting device, which includes:
a silicon-based base substrate;
at least one organic light-emitting diode device at the silicon-based base substrate;
a first encapsulation layer, at a side of the at least one organic light-emitting diode device away from the silicon-based base substrate and comprising one or more sublayers;
a color filter layer, at a side of the first encapsulation layer away from the at least one organic light-emitting diode device; and
a second encapsulation layer, at a side of the color filter layer away from the first encapsulation layer and comprising one or more sublayers,
wherein a refractive index of at least one sublayer in the first encapsulation layer is greater than a refractive index of at least one sublayer in the second encapsulation layer. For example, in the light-emitting device according to at least one embodiment of the present disclosure, the first encapsulation layer comprises a first encapsulation sublayer and a second encapsulation sublayer which are laminated, and the second encapsulation sublayer is at a side of the first encapsulation sublayer away from the organic light-emitting diode device, and comprises at least one layer of first high-molecular polymer molecules.

For example, in the light-emitting device according to at least one embodiment of the present disclosure, the first high-molecular polymer molecules comprise parylene molecules.

For example, in the light-emitting device according to at least one embodiment of the present disclosure, the first encapsulation sublayer has a multi-layer structure.

For example, in the light-emitting device according to at least one embodiment of the present disclosure, the first encapsulation sublayer comprises an inorganic material.

For example, in the light-emitting device according to at least one embodiment of the present disclosure, the first encapsulation sublayer comprises a first sub-film layer and a second sub-film layer which are made of the inorganic material, and the second sub-film layer is at a side of the first sub-film layer away from the organic light-emitting diode device.

For example, in the light-emitting device according to at least one embodiment of the present disclosure, a refractive index of the first sub-film layer is greater than a refractive index of the second sub-film layer; and
the refractive index of the second sub-film layer is greater than or equal to a refractive index of the second encapsulation sublayer.

For example, in the light-emitting device according to at least one embodiment of the present disclosure, the color filter layer comprises a plurality of color filter subunits, and the plurality of color filter subunits have at least two colors and are arranged in an array.

For example, in the light-emitting device according to at least one embodiment of the present disclosure, any two adjacent color filter subunits of different colors overlap partially; and
a portion of each of the plurality of color filter subunits overlapping with an adjacent color filter subunit of a different color corresponds to an inter-pixel area, and a portion of each of the plurality of color filter subunits not overlapping with the adjacent color filter subunit of the different color corresponds to a pixel area.

For example, in the light-emitting device according to at least one embodiment of the present disclosure, the second encapsulation layer comprises a third encapsulation sublayer and a fourth encapsulation sublayer which are laminated;
the fourth encapsulation sublayer is at a side of the third encapsulation sublayer away from the color filter layer; and
the third encapsulation sublayer comprises second high-molecular polymer molecules.

For example, in the light-emitting device according to at least one embodiment of the present disclosure, the third encapsulation sublayer comprises at least one layer of the second high-molecular polymer molecules.

For example, in the light-emitting device according to at least one embodiment of the present disclosure, the second high-molecular polymer molecules comprise parylene molecules.

For example, in the light-emitting device according to at least one embodiment of the present disclosure, the fourth encapsulation sublayer comprises an inorganic material.

For example, in the light-emitting device according to at least one embodiment of the present disclosure, a refractive index of the third encapsulation sublayer is greater than a refractive index of the fourth encapsulation sublayer.

For example, in the light-emitting device according to at least one embodiment of the present disclosure, an absolute value of a difference between refractive indexes of the first sub-film layer and the second encapsulation sublayer is greater than an absolute value of a difference between the refractive indexes of the third encapsulation sublayer and the fourth encapsulation sublayer.

For example, the light-emitting device according to at least one embodiment of the present disclosure further comprises a cover plate,
wherein the cover plate is at a side of the second encapsulation layer away from the color filter layer; and
a projection of the second encapsulation layer on the silicon-based base substrate is within a projection of the cover plate on the silicon-based base substrate.

For example, in the light-emitting device according to at least one embodiment of the present disclosure, an area of the projection of the second encapsulation layer on the silicon-based base substrate is less than an area of the projection of the cover plate on the silicon-based base substrate.

For example, in the light-emitting device according to at least one embodiment of the present disclosure, a projection of the first encapsulation layer on the silicon-based base substrate is within a projection of the second encapsulation layer on the silicon-based base substrate.

For example, in the light-emitting device according to at least one embodiment of the present disclosure, an area of the projection of the first encapsulation layer on the silicon-based base substrate is less than an area of the projection of the second encapsulation layer on the silicon-based base substrate.

At least one embodiment of the present disclosure further provides a light-emitting device, which includes:

a silicon-based base substrate;

at least one organic light-emitting diode device at the silicon-based base substrate;

a first inorganic encapsulation layer, at a side of the at least one organic light-emitting diode device away from the silicon-based base substrate;

a second inorganic encapsulation layer, at a side of the first inorganic encapsulation layer away from the silicon-based base substrate;

a first organic encapsulation layer, at a side of the second inorganic encapsulation layer away from the silicon-based base substrate;

a color filter layer, at a side of the first organic encapsulation layer away from the silicon-based base substrate;

a second organic encapsulation layer, at a side of the color filter layer away from the silicon-based base substrate; and a third inorganic encapsulation layer, at a side of the second organic encapsulation layer away from the silicon-based base substrate, wherein a refractive index of the first inorganic encapsulation layer is greater than a refractive index of the second inorganic encapsulation layer, the second inorganic encapsulation layer, the first organic encapsulation layer and the second organic encapsulation layer have refractive indexes which are substantially the same, and the refractive index of the second organic encapsulation layer is greater than a refractive index of the third inorganic encapsulation layer.

For example, in the light-emitting device according to at least one embodiment of the present disclosure, an absolute value of a difference between the refractive indexes of the first inorganic encapsulation layer and the second inorganic encapsulation layer is greater than an absolute value of a difference between the refractive indexes of the second organic encapsulation layer and third inorganic encapsulation layer.

For example, in the light-emitting device according to at least one embodiment of the present disclosure, the first inorganic encapsulation layer comprises silicon nitride;

the second inorganic encapsulation layer comprises aluminum oxide;

each of the first and second organic encapsulation layers comprises at least one layer of parylene molecules; and the third inorganic encapsulation layer comprises silicon oxide.

For example, in the light-emitting device according to at least one embodiment of the present disclosure, a thickness of the first inorganic encapsulation layer in a direction perpendicular to a surface of the silicon-based base substrate is greater than a thickness of the second inorganic encapsulation layer in the direction perpendicular to the surface of the silicon-based base substrate;

a thickness of the first organic encapsulation layer in the direction perpendicular to the surface of the silicon-based base substrate is greater than the thickness of the first inorganic encapsulation layer in the direction perpendicular to the surface of the silicon-based base substrate;

the first organic encapsulation layer and the second organic encapsulation layer have substantially same thicknesses in the direction perpendicular to the surface of the silicon-based base substrate;

the thickness of the second organic encapsulation layer in the direction perpendicular to the surface of the silicon-based base substrate is greater than a thickness of the third inorganic encapsulation layer in the direction perpendicular to the surface of the silicon-based base substrate; and the thickness of the third inorganic encapsulation layer in the direction perpendicular to the surface of the silicon-based base substrate is greater than the thickness of the second inorganic encapsulation layer in the direction perpendicular to the surface of the silicon-based base substrate, and less than the thickness of the first inorganic encapsulation layer in the direction perpendicular to the surface of the silicon-based base substrate.

At least one embodiment of the present disclosure further provides a method of manufacturing a light-emitting device, which includes:

providing an organic light-emitting diode substrate, wherein the organic light-emitting diode substrate comprises a silicon-based base substrate and at least one organic light-emitting diode device at the silicon-based base substrate;

forming a first encapsulation layer at a side of the at least one organic light-emitting diode device away from the silicon-based base substrate;

forming a color filter layer at a side of the first encapsulation layer away from the at least one organic light-emitting diode device; and forming a second encapsulation layer at a side of the color filter layer away from the first encapsulation layer, wherein a refractive index of at least one sublayer in the first encapsulation layer is greater than a refractive index of at least one sublayer in the second encapsulation layer.

For example, in the method of manufacturing the light-emitting device according to at least one embodiment of the present disclosure, the forming the first encapsulation layer comprises:

forming a first encapsulation sublayer and a second encapsulation sublayer which are laminated, wherein the second encapsulation sublayer is at a side of the first encapsulation sublayer away from the organic light-emitting diode device, the second encapsulation sublayer is formed by a molecular layer deposition method and the second encapsulation sublayer comprises at least one layer of first high-molecular polymer molecules.

For example, in the method of manufacturing the light-emitting device according to at least one embodiment of the present disclosure, the first encapsulation sublayer comprises a first sub-film layer and a second sub-film layer which are made of an inorganic material, the second sub-film layer is at a side of the first sub-film layer away from the organic light-emitting diode device; and the first high-molecular polymer molecules comprise parylene molecules.

For example, in the method of manufacturing the light-emitting device according to at least one embodiment of the present disclosure, a refractive index of the first sub-film layer is greater than a refractive index of the second sub-film layer; and the refractive index of the second sub-film layer is greater than or equal to a refractive index of the second encapsulation sublayer.

For example, in the method of manufacturing the light-emitting device according to at least one embodiment of the present disclosure, the forming the color filter layer comprises:

forming a plurality of color filter subunits, wherein the plurality of color filter subunits have at least two colors and are arranged in an array, and any two adjacent color filter subunits of different colors overlap partially.

For example, in the method of manufacturing the light-emitting device according to at least one embodiment of the present disclosure, the forming the second encapsulation layer comprises:

forming a third encapsulation sublayer and a fourth encapsulation sublayer which are laminated, wherein the fourth encapsulation sublayer is at a side of the third encapsulation sublayer away from the color filter layer, the third encapsulation sublayer comprises at least one layer of second high-molecular polymer molecules, and the fourth encapsulation sublayer comprises an inorganic material.

For example, in the method of manufacturing the light-emitting device according to at least one embodiment of the present disclosure, a refractive index of the third encapsulation sublayer is greater than a refractive index of the fourth encapsulation sublayer.

For example, in the method of manufacturing the light-emitting device according to at least one embodiment of the present disclosure, an absolute value of a difference between the refractive indexes of the first sub-film layer and the second encapsulation sublayer is greater than an absolute value of a difference between the refractive indexes of the third encapsulation sublayer and the fourth encapsulation sublayer.

For example, the method of manufacturing the light-emitting device according to at least one embodiment of the present disclosure further comprises:

forming a cover plate at a side of the second encapsulation layer away from the color filter layer, wherein a projection of the second encapsulation layer on the silicon-based base substrate is within a projection of the cover plate on the silicon-based base substrate.

At least one embodiment of the present disclosure further provides an electronic apparatus comprising the light-emitting device according to any one of the embodiments of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

Figure 1:
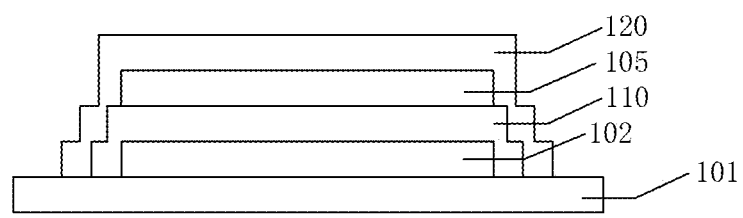
FIG. 1 is a schematic structural diagram of a light-emitting device according to at least one embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Some components of an organic light-emitting diode (OLED) display, particularly electrodes and an organic light-emitting diode located therein, are sensitive to external environmental factors, such as oxygen, water vapor, or the like, and in actual use, the device is required to be encapsulated hermetically to isolate the device from the water vapor and the oxygen, thereby prolonging a service life of the OLED. For a display in which colorization is implemented by a white light OLED in conjunction with a color filter, use of TFE (thin film encapsulation) and the color filter tends to result in an increased overall thickness of the device, thereby reducing a viewing angle of the device and affecting a display effect of the whole display. Therefore, reduction of the thickness of an encapsulation layer is important for the OLED display. Further, if exposed to an external environment for a long time, the color filter tends to age and lose efficacy.

A silicon-based organic light-emitting diode (OLED) display device has a silicon substrate as a base substrate, has the advantages of a small volume, a high resolution, or the like, and is manufactured using a mature CMOS integrated circuit process, a pixel may be actively addressed, various functional circuits, including a TCON (timing control) circuit, an OCP (operation control) circuit, or the like, may be manufactured at a silicon-based substrate, and a light weight may be achieved.

At least one embodiment of the present disclosure provides a light-emitting device, including:

a silicon-based base substrate;

at least one organic light-emitting diode (OLED) device on the silicon-based base substrate;

a first encapsulation layer at a side of the at least one OLED device away from the silicon-based base substrate and including one or more sublayers;

a color filter layer at a side of the first encapsulation layer away from the at least one OLED device; and a second encapsulation layer at a side of the color filter layer away from the first encapsulation layer and including one or more sublayers, wherein a refractive index of at least one sublayer in the first encapsulation layer is greater than a refractive index of at least one sublayer in the second encapsulation layer.

A light-emitting device according to at least one embodiment of the present disclosure will be described below with reference to FIGS. 1 to 7. In the drawings, the same reference numerals indicate the same elements.

FIG. 1 is a schematic structural diagram of a light-emitting device 100 according to at least one embodiment of the present disclosure. As shown in FIG. 1, the light-emitting device 100 includes a base substrate 101, at least one OLED device 102 and a first encapsulation layer 110. The first encapsulation layer 110 is at a side of the at least one OLED device 102 away from the base substrate 101. The light-emitting device 100 further includes a color filter layer 105 and a second encapsulation layer 120. The color filter layer 105 is at a side of the first encapsulation layer 110 away from the OLED device 102, and the second encapsulation layer 120 is at a side of the color filter layer 105 away from the first encapsulation layer 110. A refractive index of at least one sublayer in the first encapsulation layer 110 is greater than a refractive index of at least one sublayer in the second encapsulation layer 120.

The base substrate 101 may support and protect various layers or elements formed thereon, and is configured as a silicon substrate (for example, a bulk silicon substrate made of a single crystal silicon material or a silicon-on-insulator (SOI) substrate). The base substrate 101 may include a pixel circuit, a gate drive circuit, a data drive circuit, or the like, for driving the respective OLED devices 102 (a detailed structure of the base substrate 101 is not shown in FIG. 1). The pixel circuit may be configured as a normal 2T1C or 4T1C pixel circuit, or a pixel circuit having functions of internal compensation, external compensation, or the like, which is not limited in the embodiments of the present disclosure. For example, the gate drive circuit (not shown) is configured to generate a gate drive signal, the data drive circuit (not shown) is configured to generate a data signal, and the gate drive circuit and the data drive circuit may have conventional circuit structures in the art, which is not limited in the embodiments of the present disclosure.

In the case where the base substrate 101 is configured as a silicon substrate, the pixel circuit, the gate drive circuit, the data drive circuit, or the like, for driving the OLED device 102 may be formed at the base substrate 101 by a semiconductor process (including, but not limited to, ion implantation, thermal oxidation, physical vapor deposition, a grinding process, a via process, or the like). The base substrate 101 may also have other peripheral circuit structures formed thereon, such as a bonding structure, a sensor structure, or the like, which is not limited in the embodiments of the present disclosure.

The OLED device 102 may include a cathode, an anode and an organic light-emitting layer sandwiched therebetween, and holes injected from the anode and electrons injected from the cathode are combined in the organic light-emitting layer to form excitons which fall from an excited state to a ground state to emit light. The OLED device 102 may emit red, blue, green or white light. In the case where the OLED device 102 emits white light, a color filter may further be provided in a light outgoing direction of the display device 100 to convert the white light into colored light, thereby implementing a colorized display device. The electrode of the OLED device 102 close to the base substrate 101 is electrically connected with the pixel circuit at the base substrate 101 to receive the drive signal generated by the pixel circuit for driving the OLED device 102. In the embodiments of the present disclosure, a top-emission type light-emitting device 100 will be described as an example. That is, light is emitted out from the light-emitting device 100 in a direction away from the base substrate 101. However, it should be understood that the embodiments of the present disclosure are not limited thereto. The electrode of the OLED device 102 away from the base substrate 101 may be at least partially transparent, and the electrode of the OLED device close to the base substrate 101 may be configured as a reflective electrode. The electrode of the OLED device 102 away from the base substrate 101 serves as one of the anode and the cathode, and the electrode of the OLED device 102 close to the base substrate 101 serves as the other of the anode and the cathode, which is not limited in the embodiments of the present disclosure.

In some embodiments, the OLED device 102 may further include at least one of a hole injection layer, a hole transport layer, an electron injection layer and an electron transport. At least one of the hole injection layer and the hole transport layer may further be provided between the anode and the organic light-emitting layer, and at least one of the electron transport layer and the electron injection layer may be provided between the organic light-emitting layer and the cathode. The organic light-emitting layer, the hole injection layer, the hole transport layer, the electron transport layer and the electron injection layer may include organic materials, and thus may be referred to as organic layers.

Figure 2:
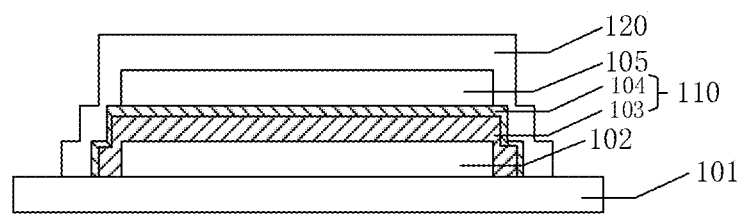
FIG. 2 is a schematic structural diagram of a light-emitting device according to at least one embodiment of the present disclosure.

The OLED device 102 may be sealed by the first encapsulation layer 110 which prevents external oxygen and moisture from penetrating into the OLED device 102. As shown in FIG. 2, in at least one embodiment of the present disclosure, the first encapsulation layer 110 may include a first encapsulation sublayer 103 and a second encapsulation sublayer 104 which are laminated. The second encapsulation sublayer 104 is at a side of the first encapsulation sublayer 103 away from the OLED device 102, and includes at least one layer of first high-molecular polymer molecules.

The first encapsulation sublayer 103 may be formed at the OLED device 102 with methods, such as chemical vapor deposition (CVD) (for example, plasma enhanced chemical vapor deposition (PECVD)), ion plating, atomic layer deposition (ALD), or the like. The first encapsulation sublayer 103 may be made of an inorganic material, which may be, for example, at least one of aluminum nitride, silicon nitride (SiNx), silicon oxynitride, silicon oxide, aluminum oxide, diamond-like carbon, or the like.

The second encapsulation sublayer 104 may be formed at the side of the first encapsulation sublayer 103 away from the OLED device 102 with, for example, a molecular layer deposition (MLD) method. The second encapsulation sublayer 104 may be made of a high-molecular polymer material, which may be, for example, one of: parylene, acrylic resins, methacrylic resins, polyisoprene, vinyl resins, epoxy resins, urethane resins, cellulose resins, perylene resins, or the like. A thickness of the second encapsulation sublayer 104 may be controlled precisely with the MLD method, and the second encapsulation sublayer 104 may include the at least one layer of high-molecular polymer molecules which is made of any one of the above-mentioned high-molecular polymers. For example, when made of parylene, the second encapsulation sublayer 104 may include a single layer of parylene molecules, two layers of parylene molecules, three layers of parylene molecules, five layers of parylene molecules, ten layers of parylene molecules, or the like. For example, each layer is configured as a monomolecular layer. For example, the second encapsulation sublayer 104 made of parylene molecules may have a thickness of 100 angstroms (Å), 500 angstroms (Å), 1000 angstroms (Å), 5000 angstroms (Å), or the like.

The first encapsulation sublayer 103 made of the inorganic material is covered with the second encapsulation sublayer 104, thereby achieving a function of planarizing the first encapsulation sublayer 103, and the second encapsulation sublayer 104 may also play a role of releasing a stress of the first encapsulation sublayer 103.

Furthermore, in at least one embodiment, in the MLD method, a single layer of molecules is formed per cycle, the thickness of the second encapsulation sublayer 104 may be controlled precisely, and angstrom-level (Å-level) thickness control may be realized, thereby reducing the thickness of the encapsulation layer and thus the overall thickness of the light-emitting device 100 and increasing the viewing angle of the light-emitting device 100, compared to other methods, such as ink-jet printing, or the like, which would typically form a film layer having a thickness of several microns.

It should be understood that although FIG. 2 shows a case where the first encapsulation layer 110 includes one first encapsulation sublayer 103 and one second encapsulation sublayer 104, in other embodiments, the first encapsulation layer 110 may also include more first encapsulation sublayers 103 and more second encapsulation sublayers 104. For example, in some embodiments, the first encapsulation layer 110 may include a plurality of first encapsulation sublayers 103 and a plurality of second encapsulation sublayers 104, wherein the first and second encapsulation sublayers 103, 104 may be stacked alternately.

Figure 3:
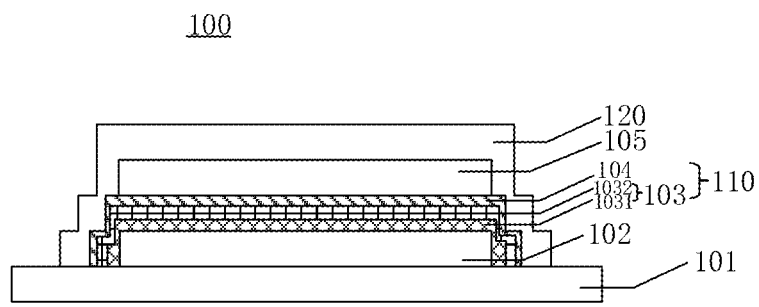
FIG. 3 is a schematic structural diagram of a light-emitting device according to at least one embodiment of the present disclosure.

Furthermore, in some embodiments, the first encapsulation sublayer 103 may also have a multi-layer structure formed by numerous layers of the above-mentioned inorganic materials. FIG. 3 shows an example of the first encapsulation sublayer 103 including a first sub-film layer 1031 and a second sub-film layer 1032 at a side of the first sub-film layer 1031 away from the OLED device 102, and the first and second sub-film layers 1031, 1032 may be made of any one of the above-mentioned inorganic materials. Similarly, in some embodiments, the second encapsulation sublayer 104 may also have a multi-layer structure formed by numerous layers of the above-mentioned high-molecular polymer materials.

In some embodiments, a refractive index of the first sub-film layer 1031 is greater than a refractive index of the second sub-film layer 1032 which has a refractive index greater than or equal to a refractive index of the second encapsulation sublayer 104. For example, the first sub-film layer 1031 may be made of silicon nitride (SiNx) having a refractive index of 1.85, the second sub-film layer 1032 may be made of aluminum oxide having a refractive index of 1.6, and the second encapsulation sublayer 104 may be made of parylene having a refractive index of 1.6.

For example, the first sub-film layer 1031 made of silicon nitride (SiNx) may have a thickness of 1000 angstroms (Å), 2000 angstroms (Å), 3000 angstroms (Å), or the like, and the second sub-film layer 1032 made of aluminum oxide may have a thickness of 500 angstroms (Å), 1000 angstroms (Å), or the like.

The color filter layer 105 is at the side of the first encapsulation layer 110 away from the OLED device 102. In FIG. 3, the color filter layer 105 is at a side of the second encapsulation sublayer 104 away from the OLED device 102, and the second encapsulation sublayer 104 is used as a base layer of the color filter layer 105, thereby preventing the first encapsulation layer 110 from being damaged by a manufacturing procedure of the color filter layer 105. The color filter layer 105 is at a light outgoing path of the light-emitting device 100, and may convert light emitted by the OLED device 102 into light of another color. The color filter layer may be made of known materials by known manufacturing methods in the art, which is not limited in the embodiments of the present disclosure. For example, the second encapsulation sublayer 104 may be made of parylene molecules having good stability, and may be used as a base layer of the color filter layer 105, thereby preventing the first encapsulation layer 110 from being damaged by the manufacturing procedure of the color filter layer 105.

Figure 4:
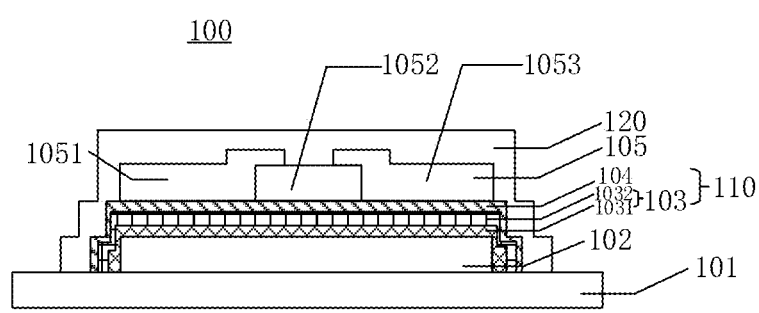
FIG. 4 is a schematic structural diagram of a light-emitting device according to at least one embodiment of the present disclosure.

In some embodiments, the color filter layer 105 may include a plurality of color filter subunits arranged in an array and having at least two colors. For example, as shown in FIG. 4, the color filter layer 105 may include a red color filter subunit 1051, a green color filter subunit 1052 and a blue color filter subunit 1053 which are arranged in an array, although it should be understood that the embodiments of the present disclosure are not limited thereto.

In some embodiments, among the plurality of color filter subunits of the color filter layer 105, any two adjacent color filter subunits of different colors overlap partially. For example, the green color filter subunit 1052 overlaps with the adjacent red and blue color filter subunits 1051, 1053 in corresponding non-light-emitting areas between green pixels and red pixels and between green pixels and blue pixels respectively. Therefore, the contrast of each pixel may be increased, and a cross color may be reduced, without forming a black matrix between the pixels.

The second encapsulation layer 120 is configured to encapsulate the color filter layer 105 and prevent external oxygen and moisture from penetrating into the color filter layer 105 and the OLED device 102. Furthermore, the second encapsulating layer 120 is also configured to prevent the color filter layer 105 from being damaged by a subsequent manufacturing procedure. The second encapsulation layer 120 may be the same as or different from the first encapsulation layer 110, which is not limited in the embodiments of the present disclosure.

In some embodiments, a projection of the first encapsulation layer 110 on the base substrate 101 is within a projection of the second encapsulation layer 120 on the base substrate 101. For example, the area covered by the projection of the second encapsulation layer 120 on the base substrate 101 is greater than the area covered by the projection of the first encapsulation layer 110 on the base substrate 101.

Furthermore, both the first and second encapsulating layers 110, 120 may come into contact with a surface of the base substrate 101 to form a sealing structure, thereby implementing dual effective encapsulation of the OLED device 102 (i.e., the first and second encapsulating layers 110, 120), more effectively blocking water vapor, oxygen, or the like, and achieving the purposes of protecting the OLED device 102 and prolonging the service life of the OLED device 102.

Figure 5:
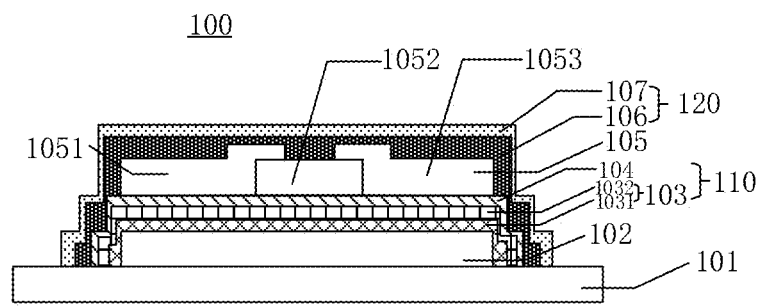
FIG. 5 is a schematic structural diagram of a light-emitting device according to at least one embodiment of the present disclosure.

As shown in FIG. 5, in some embodiments, the second encapsulation layer 120 may include at least one third encapsulation sublayer 106 made of a high-molecular polymer material and at least one fourth encapsulation sublayer 107 made of an inorganic material. FIG. 5 shows an example in which the second encapsulation layer 120 includes one third encapsulation sublayer 106 and one fourth encapsulation sublayer 107, although it should be understood that the embodiments of the present disclosure are not limited thereto.

The third encapsulation sublayer 106 may be formed at the side of the color filter layer 105 away from the first encapsulation layer 110 by, for example, the MLD method. The third encapsulation sublayer 106 may be made of a high-molecular polymer material, which may be, for example, one of parylene, acrylic resins, methacrylic resins, polyisoprene, vinyl resins, epoxy resins, urethane resins, cellulose resins, perylene resins, or the like. A thickness of the third encapsulation sublayer 106 may be controlled precisely by the MLD method, and the third encapsulation sublayer 106 may include the at least one layer of high-molecular polymer molecules which is made of any one of the above-mentioned high-molecular polymers. For example, when the second encapsulation sublayer 104 is made of parylene, the third encapsulation sublayer 106 may include a single layer of parylene molecules, two layers of parylene molecules, three layers of parylene molecules, five layers of parylene molecules, ten layers of parylene molecules, or the like. It should be understood that the high-molecular polymer molecules forming the third encapsulation sublayer 106 may be the same as or different from the high-molecular polymer molecules forming the second encapsulation sublayer 104, which is not limited in the embodiments of the present disclosure. For example, the second encapsulation sublayer 104 made of parylene molecules may have a thickness of 100 angstroms (Å), 500 angstroms (Å), 1000 angstroms (Å), 5000 angstroms (Å), or the like.

By means of the MLD method, the thickness of the third encapsulation sublayer 106 may be controlled precisely, and angstrom-level (Å-level) thickness control may be realized, thereby reducing the thickness of the encapsulation layer and thus the overall thickness of the light-emitting device 100 and increasing the viewing angle of the light-emitting device 100, compared to other methods, such as ink-jet printing, or the like, which would typically form a film layer having a thickness of several microns.

The third encapsulation sublayer 106 covers the color filter layer 105 to planarize the color filter layer 105, thereby preventing the fourth encapsulation sublayer 107 formed at the third encapsulation sublayer 106 from being broken. Furthermore, the third encapsulation sublayer 106 may serve as a buffer layer to reduce a stress of the fourth encapsulation sublayer 107 formed thereon.

The fourth encapsulation sublayer 107 may be made of the inorganic material, which may be, for example, at least one of aluminum nitride, silicon nitride (SiNx), silicon oxynitride, silicon oxide, aluminum oxide, diamond-like carbon, or the like. The fourth encapsulation sublayer 107 may be formed at a side of the third encapsulation sublayer 106 away from the third encapsulation sublayer 106 by methods, such as chemical vapor deposition (CVD) (for example, plasma enhanced chemical vapor deposition (PECVD)), ion plating, atomic layer deposition (ALD), or the like. The fourth encapsulation sublayer 107 may have a better effect of preventing oxygen and moisture penetration than the third encapsulation sublayer 106. It should be understood that the high-molecular polymer molecules forming the fourth encapsulation sublayer 107 may be the same as or different from the high-molecular polymer molecules forming the first encapsulation sublayer 103, which is not limited in the embodiments of the present disclosure. For example, the fourth encapsulation sublayer 107 may be made of silicon oxide and have a thickness of 1000 angstroms (Å).

In some embodiments, a refractive index of the third encapsulation sublayer 106 may be greater than a refractive index of the fourth encapsulation sublayer 107. For example, the third encapsulation sublayer 106 may be made of parylene having a refractive index of 1.6, and the fourth encapsulation sublayer 107 may be made of silicon oxide having a refractive index of 1.5.

The color filter layer 105 is sandwiched between the first and second encapsulation layers 110, 120 and may release stresses of the first and second encapsulation layers 110, 120 (for example, the first encapsulation sublayer 103 in the first encapsulation layer 110 and the fourth encapsulation sublayer 107 in the second encapsulation layer 120).

In some embodiments, a refractive index of the first encapsulation layer 110 may be greater than a refractive index of the second encapsulation layer 120, so as to enable a difference between the refractive indexes of the second encapsulation layer 120 close to air and the air to be small, thereby increasing a light outgoing ratio. In an exemplary embodiment, an absolute value of the difference between refractive indexes of the first sub-film layer 1031 and the second encapsulation sublayer 104 is greater than an absolute value of the difference between refractive indexes of the third and fourth encapsulation sublayers 106, 107. For example, the first sub-film layer 1031 may be made of silicon nitride (SiNx) having a refractive index of 1.85, the second encapsulation sublayer 104 may be made of parylene having a refractive index of 1.6, the third encapsulation sublayer 106 may be made of parylene having a refractive index of 1.6, and the fourth encapsulation sublayer 107 may be made of silicon oxide having a refractive index of 1.5. Therefore, the difference between the refractive indexes of the first sub-film layer 1031 and the second encapsulation sublayer 104 has the absolute value of 0.25 which is greater than an absolute value of 0.1 of the difference between the refractive indexes of the third and fourth encapsulation sublayers 106, 107.

Figure 6:
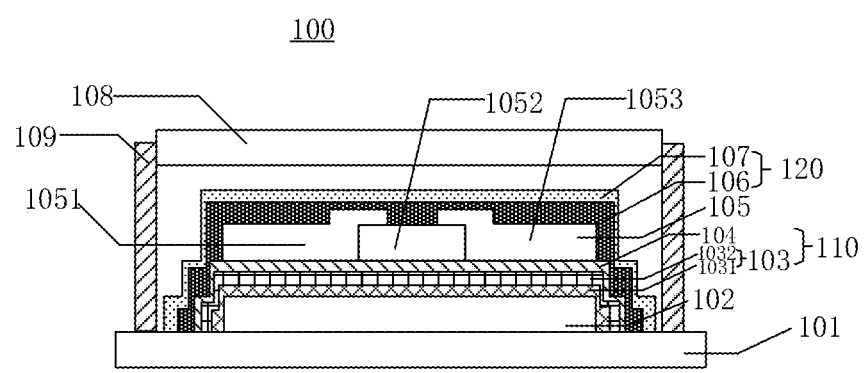
FIG. 6 is a schematic structural diagram of a light-emitting device according to at least one embodiment of the present disclosure.

As shown in FIG. 6, in at least one embodiment, the light-emitting device 100 may further include a cover plate 108 located at the side of the second encapsulation layer 120 away from the color filter layer 105. The cover plate 108 may be made of, for example, plastic, glass, or the like, prevent ingress of external oxygen and moisture and protect the second encapsulation layer 120. For example, the cover plate 108 may be connected with the base substrate 101 by a sealant 109 to block ingress of water vapor, thereby prolonging the service life of the light-emitting device 100.

For example, an attaching height of the sealant 109 at the peripheral side of the cover plate 108 is greater than ½ of a thickness of the cover plate 108 and less than the thickness of the cover plate 108. That is, a distance between an upper edge of the sealant 109 and an upper surface of the cover plate 108 is less than ½ of the thickness of the cover plate 108, thus guaranteeing a sealing effect and preventing an increase of the thickness of the display device caused when the sealant is higher than the upper surface of the cover plate 108. By sealing between the peripheral side of the cover plate 108 and the silica-based base substrate with the sealant 109, blockage of water and oxygen ingress is further guaranteed, and then the service life of the OLED display device is prolonged greatly.

In some embodiments, a projection of the second encapsulation layer 120 on the base substrate 101 is within a projection of the cover plate 108 on the base substrate 101. For example, the area covered by the projection of the cover plate 108 on the base substrate 101 is greater than the area covered by the projection of the second encapsulation layer 120 on the base substrate 101.

Figure 7:
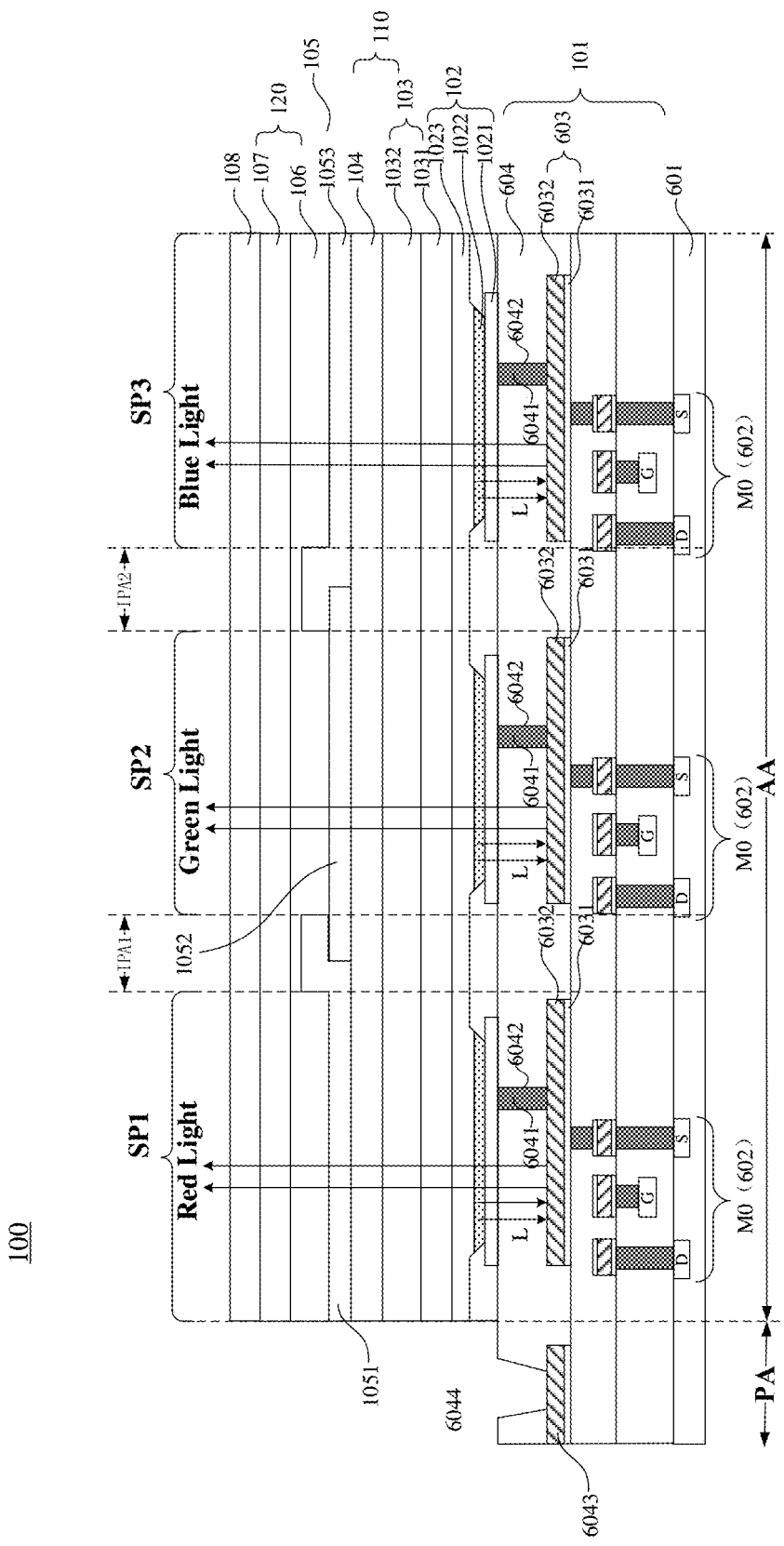
FIG. 7 is a cross-sectional view of part of a light-emitting device according to at least one embodiment of the present disclosure.

FIG. 7 is a cross-sectional view of part of the light-emitting device according to at least one embodiment of the present disclosure. The base substrate 101 in this embodiment is substantially the same as the base substrate 101 shown in FIGS. 1 to 6 except that the structure of the base substrate 101 is shown in more detail and a plurality of sub-pixels are shown in FIG. 7. It should be understood that the base substrate 101 in this embodiment may be identical to or substantially the same as the base substrate 101 shown in FIGS. 1 to 6, and for conciseness of description, a detailed structure of the base substrate 101 is not shown in FIGS. 1 to 6. Certainly, the base substrate 101 in this embodiment may also be different from the base substrate 101 shown in FIGS. 1 to 6, as long as corresponding functions may be achieved. It should be understood that the base substrate 101 shown in FIGS. 1 to 6 also includes a plurality of sub-pixels which are not shown in FIG. 1 for simplicity of description. In FIG. 7, the light-emitting device 100 is defined to be an array area AA and a peripheral area PA.

In this embodiment, as shown in FIG. 7, the base substrate 101 includes a silicon base 601, a pixel circuit 602, a light reflecting layer 603 and an insulating layer 604 which are laminated sequentially. The OLED device 102 includes an anode layer 1021, an organic light-emitting layer 1022 and a cathode layer 1023 which are laminated on the insulating layer 604 sequentially. The anode layer 1021 is a transparent electrode layer.

For example, the light reflecting layer 603 may include a metal layer 6032 and a protective layer 6031. The protective layer 6031 is laminated with the metal layer 6032 and at a side of the metal layer 6032 close to the silicon base 601. That is, the protective layer 6031 is at a surface of the metal layer 6032 close to the silicon base 601. Thus, the protective layer 6031 may prevent the metal layer 6032 from being oxidized. The metal layer 6032 is made of, for example, aluminum or an aluminum alloy. Since aluminum or an aluminum-copper alloy has a little resistance and high reflectivity, outgoing light luminance and outgoing light efficiency of a display panel may be improved. For example, the metal layer 6032 has a thickness in a range of 10 nm to 1000 nm. For example, the protective layer is made of a conductive material, such as titanium nitride (TiN). Since the protective layer 6031 is not provided at a surface of the metal layer 6032 close to the anode layer 1021, light emitted by the organic light-emitting layer 1022 and passing through the anode layer 1021 and the insulating layer 603 may be directly incident at the surface of the metal layer 6032, thus reducing a loss of the light at the interface and increasing a light reflecting efficiency and the outgoing light luminance of the display panel. However, it should be understood that the protective layer may not be provided in the light reflecting layer.

For example, the insulating layer 604 is capable of transmitting light to allow the light emitted by the organic light-emitting layer 1022 to pass therethrough and reach the light reflecting layer 603 to be reflected by the light reflecting layer 603.

For example, the insulating layer 604 includes a via hole 6042 filled with a metal member 6041, and the light reflecting layer 603 is electrically connected with the anode layer 1021 by the metal member 6041. Thus, formation of a conductive channel in the insulating layer 604 between the light reflecting layer 603 and the anode layer 1021 facilitates transmission of an electric signal provided by the pixel circuit 602 in the base substrate 101 to the anode layer 1021 through the light reflecting layer 603. In this way, not only control over the OLED device 102 by the pixel circuit 602 is facilitated, but also a structure of the light-emitting device 100 is more compact, which facilitates miniaturization of the device. Further, for example, the metal member 6041 is made of a metal material, such as a tungsten metal, and the via hole filled with tungsten metal is also referred to as a tungsten via hole (W-via). For example, in the case where the insulating layer 604 has a larger thickness, formation of the tungsten via hole in the insulating layer 604 may guarantee stability of a conductive path, and since the process of manufacturing the tungsten via hole is mature, the resulting insulating layer 604 has good surface flatness, which facilitates reduction of a contact resistance between the insulating layer 604 and the anode layer 1021. It may be understood that the tungsten via hole is suitable for implementing electrical connections not only between the insulating layer 604 and the anode layer 1021, but also between the light reflecting layer 603 and the pixel circuits 602, as well as electrical connection between other wiring layers.

For example, the base substrate 101 includes the pixel circuit 602, the pixel circuit 602 and the light reflecting layer 603 are electrically connected with each other, and the pixel circuit 602 is used for driving the OLED device 102 to emit light. The pixel circuit 602 includes at least a driving transistor M0 and a switching transistor (not shown), and the driving transistor M0 and the light reflecting layer 603 are electrically connected with each other. Thus, the electric signal for driving the OLED device 102 may be transmitted to the anode layer 1021 through the light reflecting layer 603, thereby controlling the OLED device 102 to emit light. For example, the driving transistor M0 includes a gate electrode G, a source electrode S and a drain electrode D. The source electrode S of the driving transistor M0 is electrically connected to the light reflecting layer 603. When the driving transistor M0 is in a turned-on state and a saturation state, a drive current supplied by a power line may be transmitted to the anode layer 1021 through the source electrode S of the driving transistor M0 and the light reflecting layer 603 under the control of a data voltage applied by the gate electrode. Due to a voltage difference between the anode and cathode layers 1021, 1023, an electric field is formed therebetween, the holes and the electrons are injected into the organic light-emitting layer 1022 respectively and combined, and thus the organic light-emitting layer 1022 emits light under the action of the electric field. It may be understood that in the driving transistor M0, the positions of the source and drain electrodes S, D are interchangeable, and therefore one of the source and drain electrodes S, D may be connected with the light reflecting layer 603.

For example, the light-emitting device 100 includes a plurality of sub-pixels (or pixel units), and FIG. 7 shows three sub-pixels exemplarily, i.e., a red sub-pixel SP1, a green sub-pixel SP2 and a blue sub-pixel SP3. Each sub-pixel corresponds to a sub-pixel area of the base substrate 101. That is, each sub-pixel is provided therein with the independent OLED device 102 and the driving transistor M0.

For example, the insulating layers 604 in the three sub-pixels are integrally formed to facilitate fabrication. For example, as shown in FIG. 7, the insulating layer 604 further includes an opening 6044 for exposing a pad 6043, and the arrangement of the opening 6044 facilitates the electrical connection and signal communication between the pad 6043 and an external circuit. For example, the opening 6044 for exposing the pad 6043 is located in the peripheral area PA. The colors of the sub-pixels in the base substrate 101 are merely illustrative, and other colors, such as yellow, white, or the like may be adopted.

For example, as shown in FIG. 7, a first encapsulation layer 110, a color filter layer 105, a second encapsulation layer 120 and a cover plate 108 are sequentially laminated on the cathode layer 1023, the first encapsulation layer 110 includes a first encapsulation sublayer 103 and a second encapsulation sublayer 104, and the first encapsulation sublayer 103 includes a first sub-film layer 1031 and a second sub-film layer 1032; the second encapsulation layer 120 includes a third encapsulation sublayer 106 and a fourth encapsulation sublayer 107.

For example, in the light-emitting device 100 according to the embodiment of the present disclosure, the OLED device 102 including the anode layer 1021, the organic light-emitting layer 1022 and the cathode layer 1023, the first encapsulation layer 110, the color filter layer 105, the second encapsulation layer 120 and the cover plate 108 may be manufactured in a display panel factory, and in addition, in the same process, the insulating layer 604 above the pad 6043 may be etched to expose and enable the pad 6043 to be bonded to a flexible printed circuit (FPC) board or a wire. Therefore, in the embodiments of the present disclosure, for example, the base substrate 101 including the light reflecting layer 603 and the insulating layer 604 and suitable for forming the OLED device 102 may be manufactured by a wafer factory, and then the structure at the base substrate may be manufactured in the display panel factory, which not only reduces a manufacturing difficulty of the light reflecting layer 603, but also facilitates subsequent manufacturing procedures of the panel factory.

For example, as shown in FIG. 7, the color filter layer 105 may include a red color filter subunit 1051, a green color filter subunit 1052 and a blue color filter subunit 1053 which are arranged in an array, although it should be understood that the embodiments of the present disclosure are not limited thereto.

In some embodiments, among the plurality of color filter subunits of the color filter layer 105, any two adjacent color filter subunits of different colors overlap partially. For example, the green color filter subunit 1052 overlaps with the adjacent red and blue color filter subunits 1051, 1053 in corresponding non-light-emitting areas between green pixels and red pixels and between green pixels and blue pixels respectively.

A portion of each color filter subunit overlapping with the adjacent color filter subunit of a different color corresponds to an inter-pixel area, and a portion of each color filter subunit not overlapping with the adjacent color filter subunit of the different color corresponds to a pixel area. The inter-pixel area mentioned here corresponds to the above-mentioned non-light-emitting area between adjacent pixels. As shown in FIG. 7, the portion of the red color filter subunit 1051 overlapping with the green color filter subunit 1052 corresponds to the inter-pixel area IPA1, and the portion of the red color filter subunit 1051 not overlapping with the green color filter subunit 1052 corresponds to the area of the red sub pixel SP1; the portion of the blue color filter subunit 1053 overlapping with the green color filter subunit 1052 corresponds to the inter-pixel area IPA2, and the portion of the blue color filter subunit 1053 not overlapping with the green color filter subunit 1052 corresponds to the area of the blue sub pixel SP3; the portion of the green color filter subunit 1052 overlapping with the red color filter subunit 1051 corresponds to the inter-pixel area IPA1, the portion of the green color filter subunit 1052 overlapping with the blue color filter subunit 1053 corresponds to the inter-pixel area IPA2, and the portion of the green color filter subunit 1052 not overlapping with the red and green color filter subunits 1051, 1053 corresponds to the area of the green sub pixel SP1. Therefore, the contrast of each pixel may be increased, and a cross color may be reduced, without forming a black matrix between the pixels.

At least one embodiment of the present disclosure further provides a light-emitting device, including: a silicon-based base substrate, at least one organic light-emitting diode device at the silicon-based base substrate, a first inorganic encapsulation layer, a second inorganic encapsulation layer and a first organic encapsulation layer. The first inorganic encapsulation layer is at a side of the at least one organic light-emitting diode device away from the silicon-based base substrate. The second inorganic encapsulation layer is at a side of the first inorganic encapsulation layer away from the base substrate. The first organic encapsulation layer is at a side of the second inorganic encapsulation layer away from the base substrate. The light-emitting device may further include a color filter layer, a second organic encapsulation layer and a third inorganic encapsulation layer. The color filter layer is at a side of the first organic encapsulation layer away from the base substrate. The second organic encapsulation layer is at a side of the color filter layer away from the base substrate. The third inorganic encapsulation layer is at a side of the second organic encapsulation layer away from the base substrate.

A refractive index of the first inorganic encapsulation layer is greater than a refractive index of the second inorganic encapsulation layer. The second inorganic, first organic and second organic encapsulation layers have refractive indexes which are substantially the same, and a refractive index of the second organic encapsulation layer is greater than a refractive index of the third inorganic encapsulation layer. It should be understood that in at least one embodiment of the present disclosure, the refractive indexes of the second inorganic, first organic and second organic encapsulation layers being substantially the same may mean that the refractive indexes are the same, are substantially the same, or have differences within a preset range. For example, any two of the refractive indexes of the second inorganic encapsulation layer and the first and second organic encapsulation layers has a difference within 5% to −5% of a compared refractive index.

The base substrate 101, the OLED device 102, the first and second sub-film layers 1031, 1032 and the second encapsulation sublayer 104 in the above-mentioned embodiments are examples of the silicon-based base substrate, the organic light-emitting diode device, the first inorganic, second inorganic and first organic encapsulation layers in the present embodiment respectively. Furthermore, the color filter layer 105 and the third and fourth encapsulation sublayers 106, 107 in the above-mentioned embodiments are examples of the color filter layer and the second organic and third inorganic encapsulation layers in the present embodiment respectively. Description of the silicon-based base substrate, the organic light-emitting diode device, and the first inorganic, second inorganic, first organic, second organic and third inorganic encapsulation layers may refer to the above embodiments and will not be repeated in the present disclosure.

For example, an absolute value of the difference between the refractive indexes of the first inorganic encapsulation layer and the second inorganic encapsulation layer or the first organic encapsulation layer may be greater than an absolute value of the difference between the refractive indexes of the second organic and third inorganic encapsulation layers. For example, the first inorganic encapsulation layer may be made of silicon nitride (SiNx) having a refractive index of about 1.85, the second inorganic encapsulation layer may be made of aluminum oxide having a refractive index of about 1.6, both the first and second organic encapsulation layers may be made of parylene having a refractive index of about 1.6, and the third inorganic encapsulation layer may be made of silicon oxide having a refractive index of about 1.5. Thus, the difference between the refractive indexes of the first inorganic encapsulation layer and the second inorganic encapsulation layer or the first organic encapsulation layer has an absolute value of 0.25, which is greater than an absolute value of 0.1 of the difference between the refractive indexes of the second organic and third inorganic encapsulation layers.

For example, the first inorganic encapsulation layer may include silicon nitride, the second inorganic encapsulation layer may include aluminum oxide, each of the first and second organic encapsulation layers includes at least one layer of parylene molecules, and the third inorganic encapsulation layer includes silicon oxide, although it should be understood that the embodiments of the present disclosure are not limited thereto.

For example, the thickness of the first inorganic encapsulation layer in a direction perpendicular to a surface of the base substrate may be greater than the thickness of the second inorganic encapsulation layer in the direction perpendicular to the surface of the base substrate. The thickness of the first organic encapsulation layer in the direction perpendicular to the surface of the base substrate is greater than the thickness of the first inorganic encapsulation layer in the direction perpendicular to the surface of the base substrate. The first and second organic encapsulation layers have substantially the same thicknesses in the direction perpendicular to the surface of the base substrate. The thickness of the second organic encapsulation layer in the direction perpendicular to the surface of the base substrate is greater than the thickness of the third inorganic encapsulation layer in the direction perpendicular to the surface of the base substrate. The thickness of the third inorganic encapsulation layer in the direction perpendicular to the surface of the base substrate is greater than the thickness of the second inorganic encapsulation layer in the direction perpendicular to the surface of the base substrate, and less than the thickness of the first inorganic encapsulation layer in the direction perpendicular to the surface of the base substrate. It should be understood that in at least one embodiment of the present disclosure, the thicknesses of the first and second organic encapsulation layers in the direction perpendicular to the surface of the base substrate being substantially the same may mean that the first and second organic encapsulation layers have the thicknesses which are the same, are substantially the same, or have a difference within a preset range in the direction perpendicular to the surface of the base substrate. For example, the thicknesses of the first and second organic encapsulation layers in the direction perpendicular to the surface of the base substrate have a difference within 5% to −5% of a compared thickness.

In some examples, the first inorganic encapsulation layer may be made of silicon nitride (SiNx) having a refractive index of about 1.85 and have a thickness in a range of about 2500 angstroms (Å) to 3500 angstroms (Å) in the direction perpendicular to the surface of the base substrate; the second inorganic encapsulation layer may be made of aluminum oxide having a refractive index of about 1.6 and have a thickness in a range of about 100 angstroms (Å) to 800 angstroms (Å) in the direction perpendicular to the surface of the base substrate; both the first and second organic encapsulation layers may be made of parylene having a refractive index of 1.6 and have a thicknesses in a range of about 4000 angstroms (Å) to 8000 angstroms (Å) in the direction perpendicular to the surface of the base substrate, and the third inorganic encapsulation layer may be made of silicon oxide having a refractive index of 1.5 and have a thickness of about 900 angstroms (Å) to 1500 angstroms (Å) in the direction perpendicular to the surface of the base substrate. For example, the first inorganic encapsulation layer may be made of silicon nitride (SiNx) having a refractive index of about 1.85 and have a thickness of about 3000 angstroms (Å) in the direction perpendicular to the surface of the base substrate; the second inorganic encapsulation layer may be made of aluminum oxide having a refractive index of about 1.6 and have a thickness of about 500 angstroms (Å) in the direction perpendicular to the surface of the base substrate; both the first and second organic encapsulation layers may be made of parylene having a refractive index of 1.6 and have thicknesses of about 5000 angstroms (Å) in the direction perpendicular to the surface of the base substrate, and the third inorganic encapsulation layer may be made of silicon oxide having a refractive index of 1.5 and have a thickness of about 1000 angstroms (Å) in the direction perpendicular to the surface of the base substrate.

The light-emitting device according to at least one embodiment of the present disclosure has a reduced total device thickness and an increased viewing angle, compared to a traditional OLED device. Furthermore, in the light-emitting device according to at least one embodiment of the present disclosure, the color filter layer may be prevented from aging and losing efficacy due to exposure to the external environment, thereby prolonging the service life of the light-emitting device.

Figure 8:
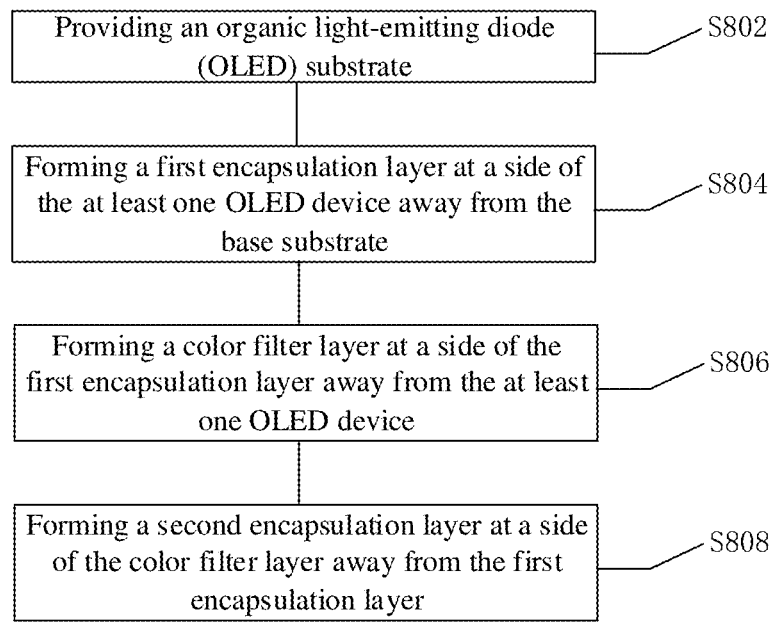
FIG. 8 is a schematic flow chart of a method of manufacturing a light-emitting device according to at least one embodiment of the present disclosure.

At least one embodiment of the present disclosure further provides a method of manufacturing a light-emitting device, which may be used for manufacturing the light-emitting device according to any one of the above-mentioned embodiments. FIG. 8 shows a schematic flow chart of a method of manufacturing a light-emitting device according to at least one embodiment of the present disclosure.

As shown in FIG. 8, the method 800 of manufacturing the light-emitting device according to at least one embodiment of the present disclosure includes steps S802 to S808.

Step S802: providing an organic light-emitting diode (OLED) substrate. In step S802, the OLED substrate includes a base substrate and at least one OLED device at the base substrate. Description of the base substrate and the OLED device may refer to the above embodiments and will not be repeated.

Step S804: forming a first encapsulation layer at a side of the at least one OLED device away from the base substrate.

In some embodiments, the first encapsulation layer includes a first encapsulation sublayer and a second encapsulation sublayer which are laminated, and the second encapsulation sublayer is at a side of the first encapsulation sublayer away from the OLED device, is formed by a molecular layer deposition method, and includes at least one layer of first high-molecular polymer molecules. For example, the first encapsulation sublayer may have a double-layer structure made of an inorganic material.

Description of the first encapsulation layer and the first and second encapsulation sublayers may refer to the above embodiments and will not be repeated.

Step S806: forming a color filter layer at a side of the first encapsulation layer away from the at least one OLED device. The color filter layer may be formed by manufacturing methods known in the art, which is not limited in the embodiments of the present disclosure.

The color filter layer may include a plurality of color filter subunits arranged in an array and having at least two colors. Among the plurality of color filter subunits of the color filter layer, any two adjacent color filter subunits of different colors overlap partially.

In an example, the plurality of color filter subunits may include a red color filter subunit, a blue color filter subunit and a green color filter subunit, and the green color filter subunit may be formed at a side of the first encapsulation layer away from the OLED device first, the red and blue color filter subunits are then formed in sequence, and one end of each of the red and blue color filter subunits overlaps with one end of the green color filter subunit which is formed previously. By forming the color filter layer in this way, problems of peeling, mura, a non-uniform thickness, or the like, of the color filter layer may be solved.

Description of the color filter layer and the color filter subunit may refer to the above embodiments and will not be repeated.

Step S808: forming a second encapsulation layer at a side of the color filter layer away from the first encapsulation layer.

The second encapsulation layer includes a third encapsulation sublayer and a fourth encapsulation sublayer which are laminated, the fourth encapsulation sublayer is at a side of the third encapsulation sublayer away from the color filter layer, the third encapsulation sublayer includes at least one layer of second high-molecular polymer molecules, and the fourth encapsulation sublayer includes an inorganic material.

Description of the second encapsulation layer and the third and fourth encapsulation sublayers may refer to the above embodiments and will not be repeated.

In some embodiments, a refractive index of at least one sublayer in the first encapsulation layer is greater than a refractive index of at least one sublayer in the second encapsulation layer, so as to enable a difference between the refractive indexes of the second encapsulation layer closer to air and the air to be small, thereby increasing the light outgoing ratio.

In at least one embodiment, the method 800 of manufacturing the light-emitting device may further include: forming a cover plate at a side of the second encapsulation layer away from the color filter layer. The cover plate may prevent ingress of external oxygen and moisture and protect the second encapsulation layer. Description of the cover plate may refer to the above embodiments and will not be repeated.

The light-emitting device formed by the method of manufacturing the light-emitting device according to at least one embodiment of the present disclosure has a reduced total device thickness and an increased viewing angle, compared to a traditional OLED device. Furthermore, in the light-emitting device, the color filter layer may be prevented from aging and losing efficacy due to exposure to the external environment, thereby prolonging the service life of the light-emitting device.

Figure 9:
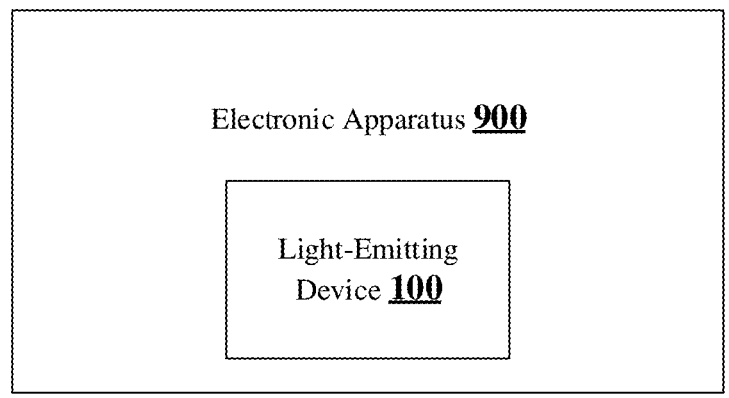
FIG. 9 is a schematic structural diagram of an electronic apparatus according to at least one embodiment of the present disclosure.

At least one embodiment of the present disclosure further provides an electronic apparatus. FIG. 9 is a schematic diagram of an electronic apparatus according to at least one embodiment of the present disclosure. As shown in FIG. 9, the electronic apparatus 900 includes the light-emitting device 100 according to any one of the embodiments of the present disclosure. For example, the electronic apparatus 900 may be configured as any product or component with a displaying function, such as a liquid crystal display television, a display, an OLED television, an electronic-paper display device, a mobile phone, a tablet computer, a notebook computer, a digital photo frame, a navigator, or the like.

It should be noted that for clarity and simplicity of representation, not all constituent units of the electronic apparatus 900 are given in the embodiments of the present disclosure. Other structures which are not shown may be provided and arranged by those skilled in the art according to specific needs to achieve basic functions of the electronic apparatus 900, which is not limited in the embodiments of the present disclosure.

Technical effects of the electronic apparatus 900 according to the above-mentioned embodiments may refer to technical effects of the display device according to the embodiments of the present disclosure, and are not repeated here.

The following statements should be noted:

(1) The accompanying drawings involve only the structure(s) in connection with the embodiment(s) of the present disclosure, and other structure(s) can be referred to common design(s).

(2) In case of no conflict, the embodiments and features in the embodiments of the present disclosure may be combined to obtain new embodiments.

What are described above is related to the illustrative embodiments of the disclosure only and not limitative to the scope of the disclosure; the scopes of the disclosure are defined by the accompanying claims.

What is claimed is:

1. A light-emitting device, comprising:
 a silicon-based base substrate;
 at least one organic light-emitting diode device at the silicon-based base substrate;
 a first encapsulation layer, at a side of the at least one organic light-emitting diode device away from the silicon-based base substrate and comprising one or more sublayers;

a color filter layer, at a side of the first encapsulation layer away from the at least one organic light-emitting diode device; and a second encapsulation layer, at a side of the color filter layer away from the first encapsulation layer and comprising one or more sublayers, wherein a refractive index of at least one sublayer in the first encapsulation layer is greater than a refractive index of at least one sublayer in the second encapsulation layer, wherein a projection of the first encapsulation layer on the silicon-based base substrate is within a projection of the second encapsulation layer on the silicon-based base substrate; and an area of the projection of the first encapsulation layer on the silicon-based base substrate is less than an area of the projection of the second encapsulation layer on the silicon-based base substrate.

2. The light-emitting device according to claim 1, wherein the first encapsulation layer comprises a first encapsulation sublayer and a second encapsulation sublayer which are laminated, and the second encapsulation sublayer is at a side of the first encapsulation sublayer away from the organic light-emitting diode device, and comprises at least one layer of first high-molecular polymer molecules.

3. The light-emitting device according to claim 2, wherein the first encapsulation sublayer has a multi-layer structure, the first encapsulation sublayer comprises an inorganic material, the first encapsulation sublayer comprises a first sub-film layer and a second sub-film layer which are made of the inorganic material, the second sub-film layer is at a side of the first sub-film layer away from the organic light-emitting diode device, a refractive index of the first sub-film layer is greater than a refractive index of the second sub-film layer, and the refractive index of the second sub-film layer is greater than or equal to a refractive index of the second encapsulation sublayer.

4. The light-emitting device according to claim 3, wherein the second encapsulation layer comprises a third encapsulation sublayer and a fourth encapsulation sublayer which are laminated;

the fourth encapsulation sublayer is at a side of the third encapsulation sublayer away from the color filter layer; and the third encapsulation sublayer comprises at least one layer of second high-molecular polymer molecules.

5. The light-emitting device according to claim 4, wherein the second high-molecular polymer molecules comprise parylene molecules, and the fourth encapsulation sublayer comprises an inorganic material.

6. The light-emitting device according to claim 4, wherein a refractive index of the third encapsulation sublayer is greater than a refractive index of the fourth encapsulation sublayer, an absolute value of a difference between refractive indexes of the first sub-film layer and the second encapsulation sublayer is greater than an absolute value of a difference between the refractive indexes of the third encapsulation sublayer and the fourth encapsulation sublayer.

7. The light-emitting device according to claim 1, wherein the first high-molecular polymer molecules comprise parylene molecules.

8. The light-emitting device according to claim 1, wherein the color filter layer comprises a plurality of color filter subunits, the plurality of color filter subunits have at least two colors and are arranged in an array, any two adjacent color filter subunits of different colors overlap partially, and a portion of each of the plurality of color filter subunits overlapping with an adjacent color filter subunit of a different color corresponds to an inter-pixel area, and a portion of each of the plurality of color filter subunits not overlapping with the adjacent color filter subunit of the different color corresponds to a pixel area.

9. The light-emitting device according to claim 1, further comprising a cover plate, wherein the cover plate is at a side of the second encapsulation layer away from the color filter layer;

the projection of the second encapsulation layer on the silicon-based base substrate is within a projection of the cover plate on the silicon-based base substrate; and the area of the projection of the second encapsulation layer on the silicon-based base substrate is less than an area of the projection of the cover plate on the silicon-based base substrate.

10. An electronic apparatus, comprising the light-emitting device according to claim 1.

11. A light-emitting device, comprising:

a silicon-based base substrate;

at least one organic light-emitting diode device at the silicon-based base substrate;

a first inorganic encapsulation layer, at a side of the at least one organic light-emitting diode device away from the silicon-based base substrate;

a second inorganic encapsulation layer, at a side of the first inorganic encapsulation layer away from the silicon-based base substrate;

a first organic encapsulation layer, at a side of the second inorganic encapsulation layer away from the silicon-based base substrate;

a color filter layer, at a side of the first organic encapsulation layer away from the silicon-based base substrate;

a second organic encapsulation layer, at a side of the color filter layer away from the silicon-based base substrate; and a third inorganic encapsulation layer, at a side of the second organic encapsulation layer away from the silicon-based base substrate, wherein a refractive index of the first inorganic encapsulation layer is greater than a refractive index of the second inorganic encapsulation layer, the second inorganic encapsulation layer, the first organic encapsulation layer and the second organic encapsulation layer have refractive indexes which are substantially the same, and the refractive index of the second organic encapsulation layer is greater than a refractive index of the third inorganic encapsulation layer.

12. The light-emitting device according to claim 11, wherein an absolute value of a difference between the refractive indexes of the first inorganic encapsulation layer and the second inorganic encapsulation layer is greater than an absolute value of a difference between the refractive indexes of the second organic encapsulation layer and third inorganic encapsulation layer.

13. The light-emitting device according to claim 11, wherein
the first inorganic encapsulation layer comprises silicon nitride;
the second inorganic encapsulation layer comprises aluminum oxide;
each of the first organic encapsulation layer and the second organic encapsulation layer comprises at least one layer of parylene molecules; and
the third inorganic encapsulation layer comprises silicon oxide.

14. The light-emitting device according to claim 11, wherein
a thickness of the first inorganic encapsulation layer in a direction perpendicular to a surface of the silicon-based base substrate is greater than a thickness of the second inorganic encapsulation layer in the direction perpendicular to the surface of the silicon-based base substrate;
a thickness of the first organic encapsulation layer in the direction perpendicular to the surface of the silicon-based base substrate is greater than the thickness of the first inorganic encapsulation layer in the direction perpendicular to the surface of the silicon-based base substrate;
the first organic encapsulation layer and the second organic encapsulation layer have substantially same thicknesses in the direction perpendicular to the surface of the silicon-based base substrate;
the thickness of the second organic encapsulation layer in the direction perpendicular to the surface of the silicon-based base substrate is greater than a thickness of the third inorganic encapsulation layer in the direction perpendicular to the surface of the silicon-based base substrate; and
the thickness of the third inorganic encapsulation layer in the direction perpendicular to the surface of the silicon-based base substrate is greater than the thickness of the second inorganic encapsulation layer in the direction perpendicular to the surface of the silicon-based base substrate, and less than the thickness of the first inorganic encapsulation layer in the direction perpendicular to the surface of the silicon-based base substrate.

15. A method of manufacturing a light-emitting device, comprising:
providing an organic light-emitting diode substrate, wherein the organic light-emitting diode substrate comprises a silicon-based base substrate and at least one organic light-emitting diode device at the silicon-based base substrate;
forming a first encapsulation layer at a side of the at least one organic light-emitting diode device away from the silicon-based base substrate;
forming a color filter layer at a side of the first encapsulation layer away from the at least one organic light-emitting diode device; and
forming a second encapsulation layer at a side of the color filter layer away from the first encapsulation layer, wherein a refractive index of at least one sublayer in the first encapsulation layer is greater than a refractive index of at least one sublayer in the second encapsulation layer, wherein a projection of the first encapsulation layer on the silicon-based base substrate is within a projection of the second encapsulation layer on the silicon-based base substrate; and
an area of the projection, of the first encapsulation layer on the silicon-based base substrate is less than an area of the projection of the second encapsulation layer on the silicon-based base substrate.

16. The method according to claim 15, wherein the forming the first encapsulation layer comprises:
forming a first encapsulation sublayer and a second encapsulation sublayer which are laminated, wherein the second encapsulation sublayer is at a side of the first encapsulation sublayer away from the organic light-emitting diode device, the second encapsulation sublayer is formed by a molecular layer deposition method and the second encapsulation sublayer comprises at least one layer of first high-molecular polymer molecules, the first encapsulation sublayer comprises a first sub-film layer and a second sub-film layer which are made of an inorganic material, the second sub-film layer is at a side of the first sub-film layer away from the organic light-emitting diode device, the first high-molecular polymer molecules comprise parylene molecules, a refractive index of the first sub-film layer is greater than a refractive index of the second sub-film layer, and the refractive index of the second sub-film layer is greater than or equal to a refractive index of the second encapsulation sublayer.

17. The method according to claim 16, wherein the forming the second encapsulation layer comprises:
forming a third encapsulation sublayer and a fourth encapsulation sublayer which are laminated, wherein the fourth encapsulation sublayer is at a side of the third encapsulation sublayer away from the color filter layer, the third encapsulation sublayer comprises at least one layer of second high-molecular polymer molecules, the fourth encapsulation sublayer comprises an inorganic material, a refractive index of the third encapsulation sublayer is greater than a refractive index of the fourth encapsulation sublayer, and an absolute value of a difference between the refractive indexes of the first sub-film layer and the second encapsulation sublayer is greater than an absolute value of a difference between the refractive indexes of the third encapsulation sublayer and the fourth encapsulation sublayer.

18. The method according to claim 15, wherein the forming the color filter layer comprises:
forming a plurality of color filter subunits, wherein the plurality of color filter subunits have at least two colors and are arranged in an array, and any two adjacent color filter subunits of different colors overlap partially.

19. The method according to claim 15, further comprising:
forming a cover plate at a side of the second encapsulation layer away from the color filter layer,
wherein the projection of the second encapsulation layer on the silicon-based base substrate is within a projection of the cover plate on the silicon-based base substrate.

* * * * *